US011971577B2

United States Patent
Tran et al.

(10) Patent No.: US 11,971,577 B2
(45) Date of Patent: *Apr. 30, 2024

(54) HETEROGENEOUSLY INTEGRATED PHOTONIC PLATFORM WITH NON-LINEAR FREQUENCY CONVERSION ELEMENT

(71) Applicants: Minh Tran, Goleta, CA (US); Tin Komljenovic, Goleta, CA (US)

(72) Inventors: Minh Tran, Goleta, CA (US); Tin Komljenovic, Goleta, CA (US)

(73) Assignee: Nexus Photonics, Inc, Goleta, CA (US)

( * ) Notice: Subject to any disclaimer, the term of this patent is extended or adjusted under 35 U.S.C. 154(b) by 116 days.

This patent is subject to a terminal disclaimer.

(21) Appl. No.: 17/838,325

(22) Filed: Jun. 13, 2022

(65) Prior Publication Data

US 2023/0400634 A1    Dec. 14, 2023

(51) Int. Cl.
*G02B 6/122* (2006.01)
*G02B 6/12* (2006.01)
(Continued)

(52) U.S. Cl.
CPC ........... *G02B 6/1228* (2013.01); *G02B 6/305* (2013.01); *H01S 5/026* (2013.01); *H01S 5/1014* (2013.01);
(Continued)

(58) Field of Classification Search
CPC .. G02B 6/1228; G02B 6/305; G02B 6/29338; G02B 2006/12061; G02B 2006/12121; G02B 2006/12173; H01S 5/026; H01S 5/1014; H01S 5/02325; H01S 5/0092; G02F 1/353; G02F 1/365
See application file for complete search history.

(56) References Cited

U.S. PATENT DOCUMENTS

| 6,480,640 | B1 * | 11/2002 | Shimonaka | G02B 6/122 |
| | | | | 372/44.01 |
| 11,808,997 | B1 * | 11/2023 | Tran | G02B 6/3572 |

(Continued)

OTHER PUBLICATIONS

Solntsev et al. "Combined frequency conversion and pulse compression in nonlinear tapered waveguides", Optics Letters, vol. 37, No. 4 , Feb. 15, 2012, pp. 446-448.*

*Primary Examiner* — Michael P Mooney
(74) *Attorney, Agent, or Firm* — Shalini Venkatesh

(57) ABSTRACT

A device comprises first, second and third elements fabricated on a common substrate. The first element comprises an active waveguide structure comprising: a first portion supporting a first optical mode. The second element comprises a passive waveguide structure supporting a second optical mode. The third element, at least partly butt-coupled to the second portion, comprises an intermediate waveguide structure supporting intermediate optical modes. At least part of the second element is non-linear, supporting frequency conversion. A tapered waveguide structure in at least one of the second and third elements facilitates efficient adiabatic transformation between the first optical mode and one intermediate optical mode. No adiabatic transformation occurs between any intermediate optical mode and the first optical mode. Mutual alignments of the elements are defined using lithographic alignment marks.

20 Claims, 8 Drawing Sheets

(51) Int. Cl.
  *G02B 6/30* (2006.01)
  *H01S 5/026* (2006.01)
  *H01S 5/10* (2021.01)
(52) U.S. Cl.
  CPC .............. *G02B 2006/12061* (2013.01); *G02B 2006/12121* (2013.01)

(56) References Cited

U.S. PATENT DOCUMENTS

| | | | | |
|---|---|---|---|---|
| 2004/0175854 A1* | 9/2004 | George | ................ | G02B 6/0033 438/30 |
| 2010/0329298 A1* | 12/2010 | Weichmann | .......... | H01S 3/0627 372/68 |
| 2021/0098960 A1* | 4/2021 | Herda | ................... | H01S 3/0057 |

\* cited by examiner

HETEROGENEOUSLY INTEGRATED PHOTONIC PLATFORM WITH NON-LINEAR FREQUENCY CONVERSION ELEMENT

FIELD OF THE INVENTION

The present invention relates to semiconductor lasers. More specifically, certain embodiments of the invention relate to improved performance of heterogeneously integrated lasers using dissimilar materials that are optically coupled with non-linear elements for frequency conversion.

BACKGROUND OF THE INVENTION

A photonic integrated circuit (PIC) or integrated optical circuit is a device that integrates multiple photonic functions and as such is analogous to an electronic integrated circuit. The major difference between the two is that a photonic integrated circuit provides functions for information signals imposed on optical carrier waves. The material platform most commercially utilized for photonic integrated circuits is indium phosphide (InP), which allows for the integration of various optically active and passive functions on the same chip. Although many current PICs are realized in InP platforms, there has been significant research in the past decade in using silicon rather than InP for the realization of PICs, due to some superior characteristics as well as superior processing capabilities for the former material, that leverage the investment already made for electronic integrated circuits.

The biggest drawback in using silicon for PICs is that it is an indirect bandgap material which makes it hard to provide electrically pumped sources. This problem is generally solved by assembling PICs comprising two or more chips made from dissimilar materials in separate processes. Such an approach is challenging due to a need for very fine alignment, which increases packaging costs and introduces scaling limitations. Another approach to solving the bandgap problem is to bond two dissimilar materials and process them together, removing the need for precise alignment during the bonding of larger pieces or complete wafers of the dissimilar materials, and allowing for mass fabrication. In this disclosure, we use the term "hybrid" to describe the first approach that includes precise assembly of separately processed parts, and we use the term "heterogeneous" to describe the latter approach of bonding two materials and then processing the bonded result to define the waveguides and other components of interest.

To transfer the optical signal between dissimilar materials, the heterogeneous approach utilizes tapers whose dimensions are gradually reduced until the effective mode refractive indices of dissimilar materials match and there is efficient power transfer. This approach generally works well when materials have similar refractive indices as is the case with silicon and InP. In cases where there is larger difference in effective indices, such as between e.g. SiN and GaAs or InP, the requirements on taper tip dimensions become prohibitive limiting efficient power transfer. Specifically, extremely small taper tip widths (of the order of tens of nanometers) may be necessary to provide good coupling. Achieving such dimensions is complex and may be cost prohibitive.

Although InP and silicon-based PICs address many current needs, they have some limitations; among them the fact that the operating wavelength range is limited by material absorption increasing the losses, and the fact that there is a limit on the maximum optical intensities and consequently optical powers that a PIC can handle. To address these limitations, alternate waveguide materials have been considered, such as SiN, $LiNbO_3$, $TiO_2$, $Ta_2O_5$, AlN or others. In general, such dielectric waveguides have higher bandgap energies which provides better high-power handling and transparency at shorter wavelength, but, in general such materials also have lower refractive indices. E.g. SiN with bandgap of ~5 eV has refractive index of ~2, AlN has bandgap of ~6 eV and refractive index of around ~2, and $SiO_2$ with bandgap of ~8.9 eV has refractive index of ~1.44. For comparison, the refractive index of both InP and GaAs is >3. This makes the tapered approach challenging.

The alternative hybrid approach suffers from the drawbacks already mentioned above, namely the need for precise alignment, and correspondingly complex packaging and scaling limitations.

A recent approach to the problems discussed above was presented in U.S. Pat. No. 10,859,764 B2 employing butt-coupling in combination with a mode-converter to allow the heterogenous process to be used without the need for extremely small taper widths. The present invention is directed towards PICs employing butt-coupling in this way, and that include a non-linear element used to convert the frequency of the direct injection optical source. Multiple non-linear effects can be utilized, and in some embodiments second harmonic generation enables chip-scale optical source performance at certain optical wavelengths that might be challenging, or even impossible, to attain with other approaches.

One example is the chip-scale integration of an InP narrow-linewidth laser (linewidths as low as 1 Hz or even lower have been demonstrated utilizing InP and SiN) operating around 1550 nm, that is frequency doubled to provide a similarly narrow linewidth source emitting at around 775 nm. The pump wavelength of such a source, based on InP as the active material, can be tuned in a very broad range, typically 1200 nm to 1800 nm but it may be even wider). It is hard to achieve a similar level of performance with GaAs based pumps (typically supporting direct emission in the 630 nm to 1100 nm wavelength range, but can also be wider) utilizing SiN waveguides, due to the inherently higher losses affecting shorter wavelengths.

A second example is addressing the green-yellow gap in available sources emitting between 520 nm and 630 nm. This wavelength region is very challenging to support with direct emission elements, with only LED sources (as opposed to laser sources) commercially available, due to the challenges associated with shifting the bandgap of GaN-based gain media to longer wavelengths. However, the wavelength "gap" region can be accessed by frequency doubling the output of GaAs sources operating between 1040 nm and 1260 nm, where direct emission from GaAs occurs with very high efficiency.

Suitably, other wavelength ranges could be accessed in a similar manner by utilizing non-linear conversion of types other than frequency doubling, using high-performance pumps integrated at a chip-scale level with a non-linear element.

In particular, embodiments described below are concerned with the detailed design of the optical coupling structures and waveguides necessary for creation of high-performance lasers that depend on non-linear elements for frequency conversion.

DETAILED DESCRIPTION

Described herein are embodiments of a platform for realization of photonic integrated circuits using wafer bonding and deposition of dissimilar materials where optical coupling is improved by use of mode conversion and a butt-coupling scheme, and where the output of an optical source is efficiently coupled to a non-linear element for frequency conversion.

In the following detailed description, reference is made to the accompanying drawings which form a part hereof, wherein like numerals designate like parts throughout, and in which are shown by way of illustration embodiments in which the subject matter of the present disclosure may be practiced. It is to be understood that other embodiments may be utilized, and structural or logical changes may be made without departing from the scope of the present disclosure. Therefore, the following detailed description is not to be taken in a limiting sense, and the scope of embodiments is defined by the appended claims and their equivalents.

The description may use perspective-based descriptions such as top/bottom, in/out, over/under, and the like. Such descriptions are merely used to facilitate the discussion and are not intended to restrict the application of embodiments described herein to any particular orientation. The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

Figure 2:
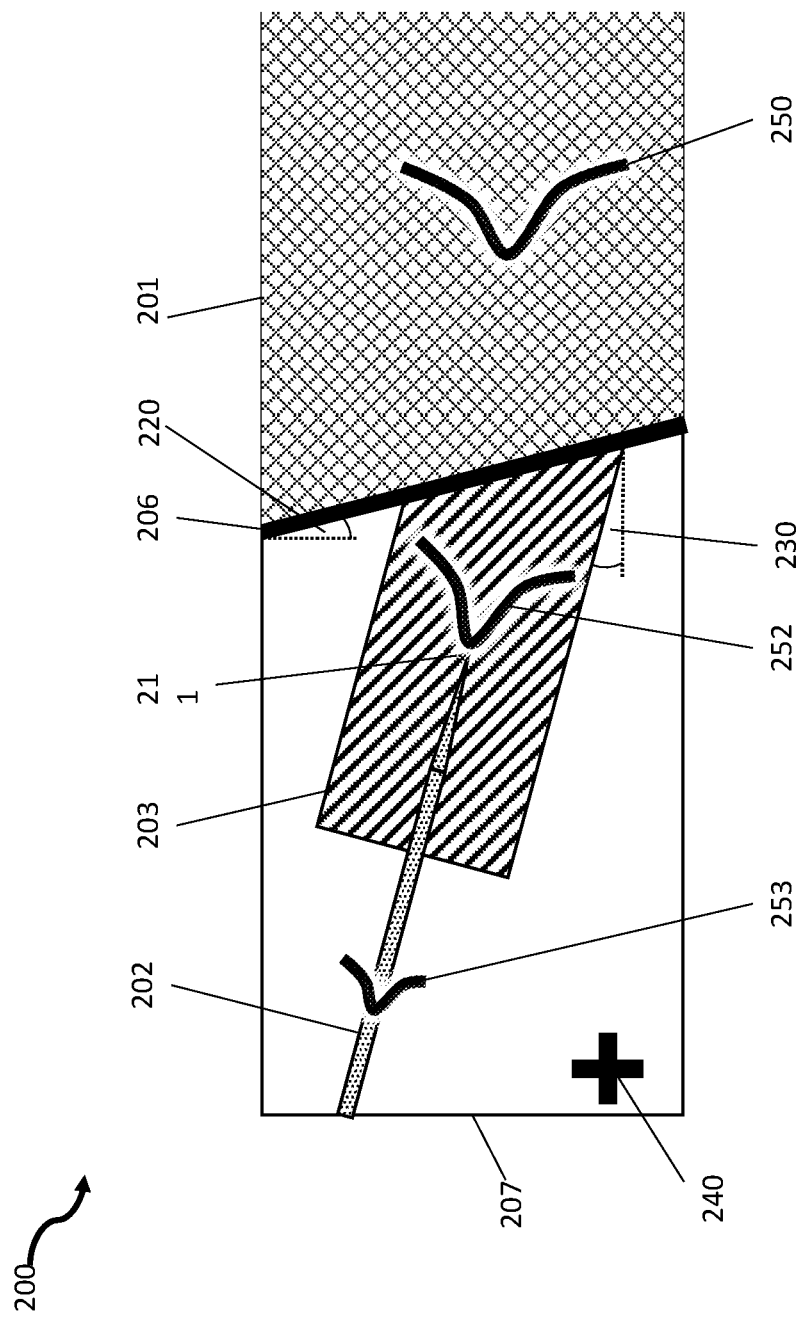
FIG. 2 shows a cross-sectional top-down view of a device according to some embodiments of the present invention.

The term "coupled with," along with its derivatives, may be used herein. "Coupled" may mean one or more of the following. "Coupled" may mean that two or more elements are in direct physical, electrical, or optical contact. However, "coupled" may also mean that two or more elements indirectly contact each other, but yet still cooperate or interact with each other, and may mean that one or more other elements are coupled or connected between the elements that are said to be coupled with each other. The term "directly coupled" means that two or more elements are in direct contact in at least part of their surfaces. The term "butt-coupled" is used herein in its normal sense of meaning an "end-on" or axial coupling, where there is minimal or zero axial offset between the elements in question. The axial offset may be, for example, slightly greater than zero in cases where a thin intervening layer of some sort is formed between the elements, such as e.g. thin coating layer typically used to provide high-reflectivity or anti-reflectivity functionality. It should be noted that the axes of two waveguide structures or elements need not be colinear for them to be accurately described as being butt-coupled. In other words, the interface between the elements need not be perpendicular to either axis. FIG. 2 embodiments discussed below are exemplary of such possibilities.

The terms "active device", "active structure" or otherwise "active" element, part, or component may be used herein. A device or a part of a device called active is capable of direct light generation, amplification, attenuation, modulation and/or detection. This is in contrast to what we mean by a "passive device" whose principal function is to confine and guide light, and/or provide splitting, combining, filtering and/or other functionalities that are commonly associated with passive devices. Some passive devices can provide functions overlapping with active device functionality, such as e.g., phase tuning implemented using thermal or similar effects that can provide modulation. No absolute distinction should be assumed between "active" and "passive" based purely on material composition or device structure. A silicon device, for example, may be considered active under certain conditions of modulation, or detection of low wavelength radiation, but passive in most other situations. Either active or passive devices may comprise elements, sections and/or parts that have non-linear properties. Non-linear properties can be utilized for frequency conversion as known in the art and described below.

Figure 1:
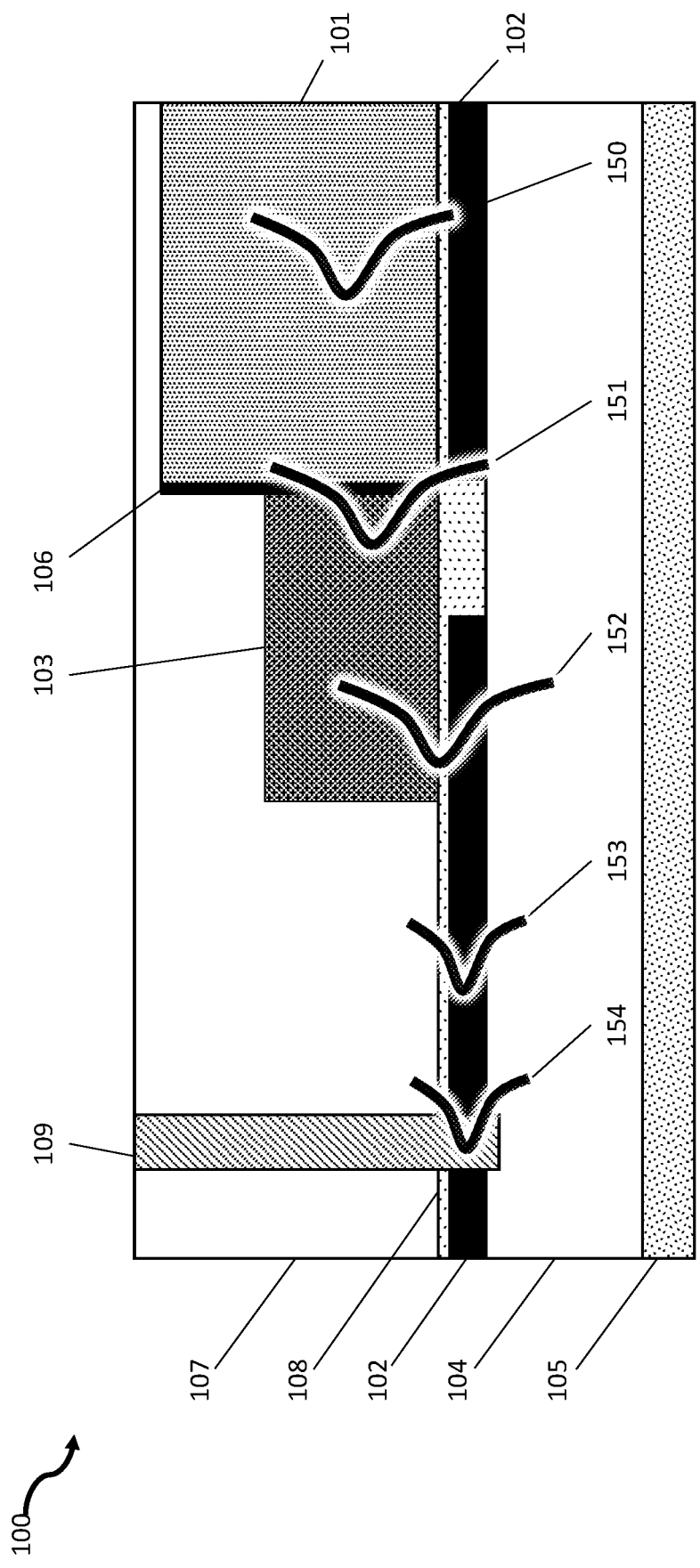
FIG. 1 illustrates a device according to one embodiment of the present invention, shown in cross section.

FIG. 1 is a schematic cross-section view of an integrated photonic device 100 utilizing butt-coupling and mode conversion for efficient coupling between dissimilar materials and utilizing a non-linear element for frequency conversion. The exemplary cross-section includes a substrate 105 that can be any suitable substrate for semiconductor and dielectric processing, such as Si, InP, GaAs, quartz, sapphire, glass, GaN, silicon-on-insulator or other materials known in the art. In the shown embodiment, a layer 104 of a second material is deposited, grown, transferred, bonded or otherwise attached to the top surface of substrate 105 using techniques known in the field. The main purpose of layer 104 is to provide an optical cladding for layer 102 (to be described below), if necessary to form an optical waveguide with 102 as the core. Optical waveguides are commonly realized by placing a higher refractive index core between two lower refractive index layers to confine the optical wave. In some embodiments, layer 104 is omitted and substrate 105 itself serves as a cladding.

Layer 102 is deposited, grown, transferred, bonded or otherwise attached to the top of layer 104 if present, and/or to the top of substrate 105, using techniques known in the field. The refractive index of layer 102 is higher than the refractive index of layer 104 if present, or, if layer 104 is not present, the refractive index of layer 102 is higher than the refractive index of substrate 105. In one embodiment, the material of layer 102 may include, but is not limited to, one or more of SiN, $SiNO_x$, $TiO_2$, $Ta_2O_5$, (doped) $SiO_2$, $LiNbO_3$ and AlN. In some embodiments, other common dielectric materials may be used for layer 102. In other embodiments, a semiconductor material may be used for layer 102. In some embodiments, the refractive index of layer 102 is between 1.44 and 2.5. Either or both of layers 104 and 102 can be patterned, etched, or redeposited as is common in the art. Layer 102 is the core for the passive waveguide structure of what is termed the second element in the claims of this disclosure.

Layer 108, whose refractive index is lower than the refractive index of layer 102, overlies layer 102 and underlies layers 101 and 103 (to be described in more detail below), serving to planarize the top surface of layer 102. In some embodiments, the planarity of the top surface of layer 108 is provided by chemical mechanical polishing (CMP) or other etching, chemical and/or mechanical polishing methods. In other embodiments, the planarity is provided because of the intrinsic nature of the method by which layer 108 is deposited, for example if the material of layer 108 is a spin-on glass, polymer, photoresist or other suitable material. The planarization may be controlled to leave a layer of desired, typically very low, thickness on top of the layer 102 (as shown in FIG. 1), or to remove all material above the level of the top surface of the layer 102 (not shown). In cases where layer 108 is left on top of layer 102, its target thickness is in the range of 10 nm to several hundreds of nm. Due to typical (common in the art) non-uniformity of the planarization process (e.g. CMP), actual thickness can vary by more than +−100 nm from the target thickness across the wafer. In some embodiments, spin-on material is used to planarize and is then etched back resulting with improved across wafer uniformity compared to typical CMP processes.

Layer 101 is bonded on top of the whole or part of the corresponding (108, 102) top surface. Layer 101 comprises the core of the active waveguide structure of what is termed the first element in the claims of this disclosure.

The bonding can be direct molecular bonding or can use additional materials to facilitate bonding such as e.g., metal layers or polymer films as is known in the art. Layer 101 forms what is commonly called an active region, and it may itself be made up of one or more materials including, but not limited to, GaAs and GaAs based ternary and quaternary materials, InP and InP based ternary and quaternary materials or any other material suitable for providing direct optical emission. Layer 101 in some embodiment is multi-layered, comprising sublayers, which together provide both optical and electrical confinement as well as electrical contacts, as is known in the art for active devices. In yet another embodiment, layer 101 uses lower layers 102, 108, 104 and/or 105 to provide electrical and/or optical confinement and one or more electrical contacts. Sublayers of layer 101 in some embodiments provide vertical confinement (up/down in FIG. 1), while lateral confinement (surface normal to the FIG. 1 cut) is provided by at least one etch as is known in the art for active device fabrication.

In some embodiments, layer 101 can be efficiently electrically pumped to generate optical emission and gain. The present invention enables efficient optical coupling between waveguides formed in layer 101 and layer 102. The material (s) of layer 102 can provide additional functionality such as wide-band transparency, high intensity handling, phase shifting by temperature, strain or other tuning mechanisms, combining, splitting, filtering and/or others as is known in the art. In some embodiments, one of the characteristics of layer 102 is a non-linearity of sufficient magnitude that it can be utilized for frequency conversion. That non-linearity can be an inherent property of the material from which layer 102 is formed, but it may be enhanced with the implementation of electrodes 109, one of which is shown in FIG. 1. At least two such electrodes are generally utilized, as will be explained in more details with the help of FIGS. 3-6. Electrodes can also be used to realize phase tuning elements, such as e.g., thermal tuning to further optimize performance. in some embodiments, electrodes can also be used to realize modulation of phase or intensity. Non-linearity, in some embodiments, provides efficient second harmonic generation. In other embodiments, nonlinearity provides efficient third harmonic generation. In yet other embodiments, different frequency conversion schemes including but not limited to four wave mixing, optical parametric oscillation, Raman and/or Brillouin effects are utilized.

Efficient coupling is facilitated by layer 103, and, in cases where layer 106 is present, by layer 106. Layer 103 is the core of the intermediate waveguide structure of what is termed the intermediate element in the claims of this disclosure.

Optional layer 106 primarily serves as either an anti-reflective or a highly reflective coating at the interface between layer 101 and layer 103. Layer 103 serves as an intermediate waveguide layer that in some embodiments accepts the profile (depicted by line 150) of an optical mode supported by the waveguide for which layer 101 provides the core, captures it efficiently as mode profile 151, and gradually transfers it to mode profiles 152, and finally 153. Mode profile 153 is efficiency coupled to the waveguide for which layer 102 provides the core. Mode profile 153 is then efficiently frequency converted using non-linearity in layer 102 to mode 154 operating at different frequency. In some embodiments frequency of mode 154 is substantially double the frequency of the mode 153. In other embodiments, frequency of mode 154 is substantially triple the frequency of the mode 153. In yet other embodiments, different relationships between frequencies of modes 153 and 154 are generated.

The refractive index of layer 103 can be engineered to facilitate efficient coupling of mode profile 150 and to efficiently transform the mode to one with mode profile 153 by taking advantage of tapered structures made in layer 102 and/or 103. In some embodiments the refractive index of layer 103 is between 1.5 and 2. The thickness of layer 103 is an optimization parameter, and in some embodiments, it is between 400 nm and 2000 nm. Prior to the present invention i.e., in the absence of intermediate layer 103, the requirements on taper tip width would be, as discussed above, problematic. The use of intermediate layer 103, however, significantly reduces the stringent requirements on taper tip width, allowing efficient transfer between very high refractive index materials (such as e.g., GaAs in layer 101) to low refractive index materials (such as e.g., SiN in layer 102).

Differences between the optical modes supported by waveguides in layers 101 and 102 respectively may or may not be obvious by observation of the mode profiles, but mode overlaps less than 100% and vertical offset (in FIG. 1) between modes 150 and 153 could (in the absence of intermediate layer 103) result in significant optical loss. In some cases, it may be considered that losses of up to 1 dB are acceptable, but losses greater than that are not. In other cases, a 3 dB loss level may be the criterion chosen. The function of layer 103 is to keep optical loss due to imperfect mode overlap below whatever is determined to be an acceptable level in a given application.

The upper cladding layer 107 for waveguides realized in 103 and/or 102 can be ambient air (meaning no cladding material is actually deposited) or can be any other deliberately deposited suitable material as shown in FIG. 1, including, but not limited to, a polymer, $SiO_2$, $SiN_x$, $SiNO_x$ etc.

In some embodiments same material is used for layer 107 and layer 108. In some embodiments (not shown), layer 107 cladding functionality can be provided with multiple depositions, e.g. one material provides the cladding for mode 153 guided by core formed in layer 102, and another material provides the cladding for mode 151 guided by core formed in layer 103. In all cases, the refractive index of cladding material is lower than the refractive index of the material which provides the core for the mode guiding. In yet another embodiment (not shown), layer 103 can provide cladding functionality to layer 102 and modes 153 and 154, owning to its refractive index being lower by design.

Layer 109 is a conductive material deposited to provide an electric field across at least part of layer 102 and facilitate, or make more efficient, its non-linear effect as will be described in more detail with the help of FIGS. 3-6. In some embodiments, layer 109 is not present and material 102 inherently provides efficient non-linear effects without needing an applied electric field. In other embodiments, additional conductive electrodes are deposited to provide tuner functionality to optimize the non-linear effect (not shown here but described with the help of FIG. 6).

One or more lithography alignment marks (not shown in this cross-sectional view, but see, for example, 240 in FIG. 2 and described below) are present to facilitate precise alignment between the layers formed during various processing steps.

In some embodiments, layer 108 is not present and both layer 101 is bonded and layer 103 is deposited on top of a non-planar layer 102. In such embodiments, there is no planarization step.

FIG. 2 depicts a top-down view of an integrated photonic device 200, according to one embodiment of the present invention, zoomed into a transition area, where boundaries between dissimilar materials are angled to control both the transmission and back reflection. Functional layers 201 to 207 (unless explicitly defined differently) correspond to functional layers 101 to 107 as described in relation to FIG. 1.

The optical mode 250 supported by active layer 201 (defined by at least one lateral etch, not shown) is guided, through optional coating layer 206 if present, into layer 203, which supports optical mode 252 and serves to convert the mode for efficient coupling to layer 202, which supports mode 253. Layer 206 can provide high reflection functionality or, alternately, can facilitate reduced reflection when designed to function as an anti-reflection coating. To facilitate coupling between modes supported by layers 201 and 202, the dimensions of layer 202 are tapered down towards layer 201, as indicated by the relatively small width of the tip 211 relative to the width of layer 202 shown at the extreme left of the figure. It has been calculated that the requirements on taper dimensions are significantly relaxed up to several hundred nanometers due to the presence of layer 203. For example, a coupling efficiency between 201 and 202 of 70% or greater may be achieved, even if the refractive index difference between 201 and 202 is larger than one, for a tip width greater than one hundred nanometers. In contrast, in the absence of layer 203, layer 201 would have to be tapered such that its mode may directly couple into layer 202, and the dimensions of the taper tip of layer 201 (not shown) would have to be much less than one hundred nanometers for a similar coupling efficiency. In another embodiment, a taper is created in layer 203 instead of in layer 202 (not shown). In yet another embodiment, tapers may be created in both layers 202 and 203 for highly efficient coupling. In some embodiments, said tapers in layers 202 and 203 can be multistage tapers meaning they utilize more than one etch depth to facilitate more efficient coupling.

Additionally, in some embodiments, one or more of the interfaces between layers 201, 206 and/or 203 are angled to reduce corresponding back reflection(s).

The angle 220 is the angle between the tangent of the direction of propagation of the wave inside structure 201 and the exit facet of 201 (its interface meeting 206 and/or 203 if layer 206 is not present). Angle 220 is primarily utilized to control the back reflection of the mode supported by layer 201 when it reaches the interface meeting 206 and/or 203, and its precise value is a result of numerical or experimental optimization. In some embodiments it ranges from 0° to 80°.

The angle 230 is the angle between the direction of the propagation of the wave inside the structure 201 and the angle of the waveguide formed by 203. Said angle is an optimization parameter for coupling efficiency between the modes supported by layer 201 and 203 and is related to the choice of the angle 220 and/or the refractive indices of used materials in layers 201 and 203 and their respective claddings. In some embodiments it ranges from 0° to 80°.

The precise vertical alignment (up/down in FIG. 2) between the axis defined by the direction of the propagation of the wave inside the structure 201 and the center of the waveguide 203 at the interface to 206 and/or 201 is an optimization parameter where such offset can be positive (up in FIG. 2), negative (down in FIG. 2) and/or substantially equal to 0 (no offset). Such optimization is straightforward to perform with numerical software to maximize the performance of the transition together with optimizing the angle 230.

Prior to the present invention i.e., in the absence of intermediate layer 103/203, the requirements on taper tip width for direct transfer between layer 101/201 and 102/202 would be problematic. The use of intermediate layer 103/203 that is butt-coupled, albeit with angled interface in some embodiments, to layer 101/201, however, significantly reduces the stringent requirements on taper tip widths, allowing efficient transfer between very high refractive index materials (such as e.g. GaAs and/or InP based layers in 101/201) to low refractive index materials (such as e.g. SiN, LiNbO3 or similar in layer 102/202). Layer 203 may comprise a dielectric, a polymer, and/or any other suitable material. No adiabatic transformation occurs between the optical modes supported by elements 101/201 and 103/203 at the butt-coupled interface. Layer 103/203 and/or layer 102/202 can comprise bends (not shown) to control the routing of the guided optical waves. One or more lithography alignment marks 240 are present to facilitate precise alignment between the layers formed during various processing steps.

Figure 3:
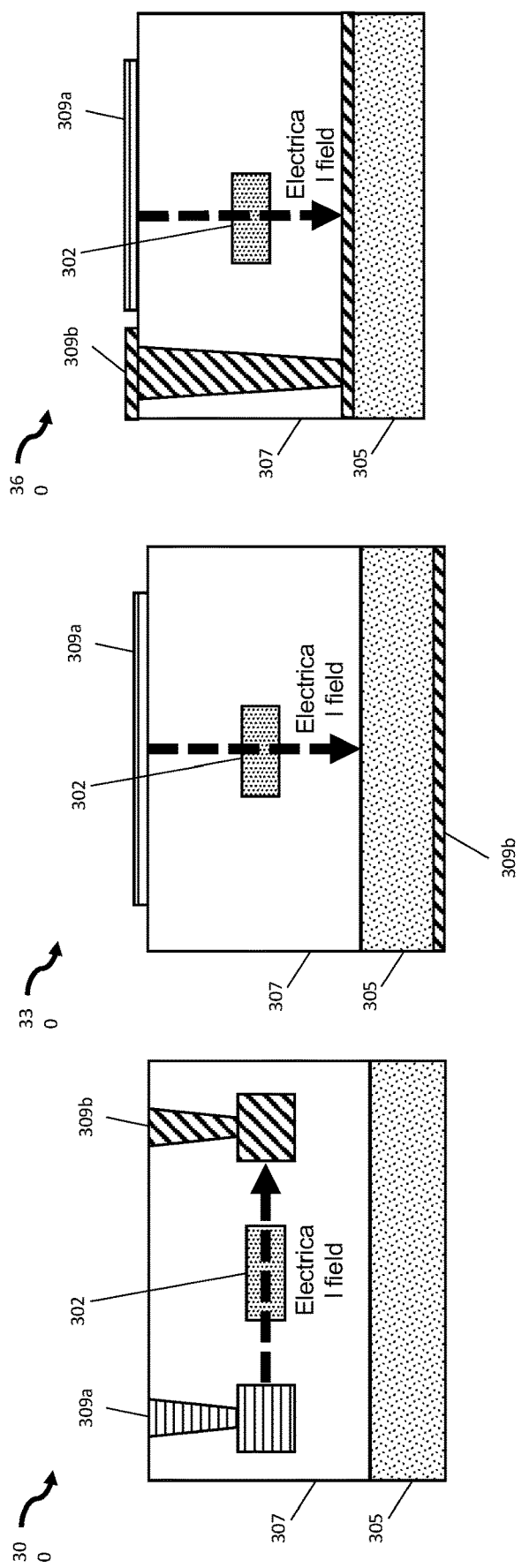
FIG. 3 shows a cross-sectional end-on views of three devices according to some embodiments of the present invention.

FIG. 3 depicts three embodiments of the present invention shown in cross-sectional end-on views 300, 330 and 360 in the region where non-linear interaction is optimized.

Said non-linearity can be an inherent property of the material from which layer 302 is formed and optimization can relate to designing the geometrical dimensions of layer 302 to maximize the effect. The non-linearity can also, or instead, be engineered by providing electrodes 309a and 309b to apply an electrical field and induce stronger non-linearities. In some embodiments (not shown), electrodes 309a and 309b are not present and the inherent material property of layer 302 provides efficient non-linear effects.

Layer 302, providing the core functionality for the passive waveguide formed therein, is surrounded by cladding material 307 that can comprise multiple sub-layers such as e.g., layers 104, 107 and 108 as described with the help of FIG. 1. In some embodiments, cladding is present on top of the substrate 305. In other embodiments, not shown, the substrate 305 can serve as at least part of the cladding for the waveguide formed in layer 302.

In the embodiment shown in view 300, two electrodes are placed laterally across the width of the waveguide to generate an electrical field when a voltage is applied across the electrodes. In the embodiment shown in view 330, two electrodes are placed vertically across the depth of the waveguide, to generate an electrical field when a voltage is applied across the electrodes. In some embodiments, substrate 305 is conductive and serves to increase the strength of the electric field at the waveguide 302. In the embodiment shown in view 360, two electrodes are placed vertically to generate an electrical field when voltage is applied across the electrodes, similar to the situation in view 330, but in 360, both electrodes have contacts positioned on the same side of the wafer (on the top as shown).

Various other embodiments, providing similar functionality can be envisioned with a goal of applying an optimized electrical field across the core of the passive waveguide defined in layer 102, including utilization of the conductivity in layer 102.

Figure 4:
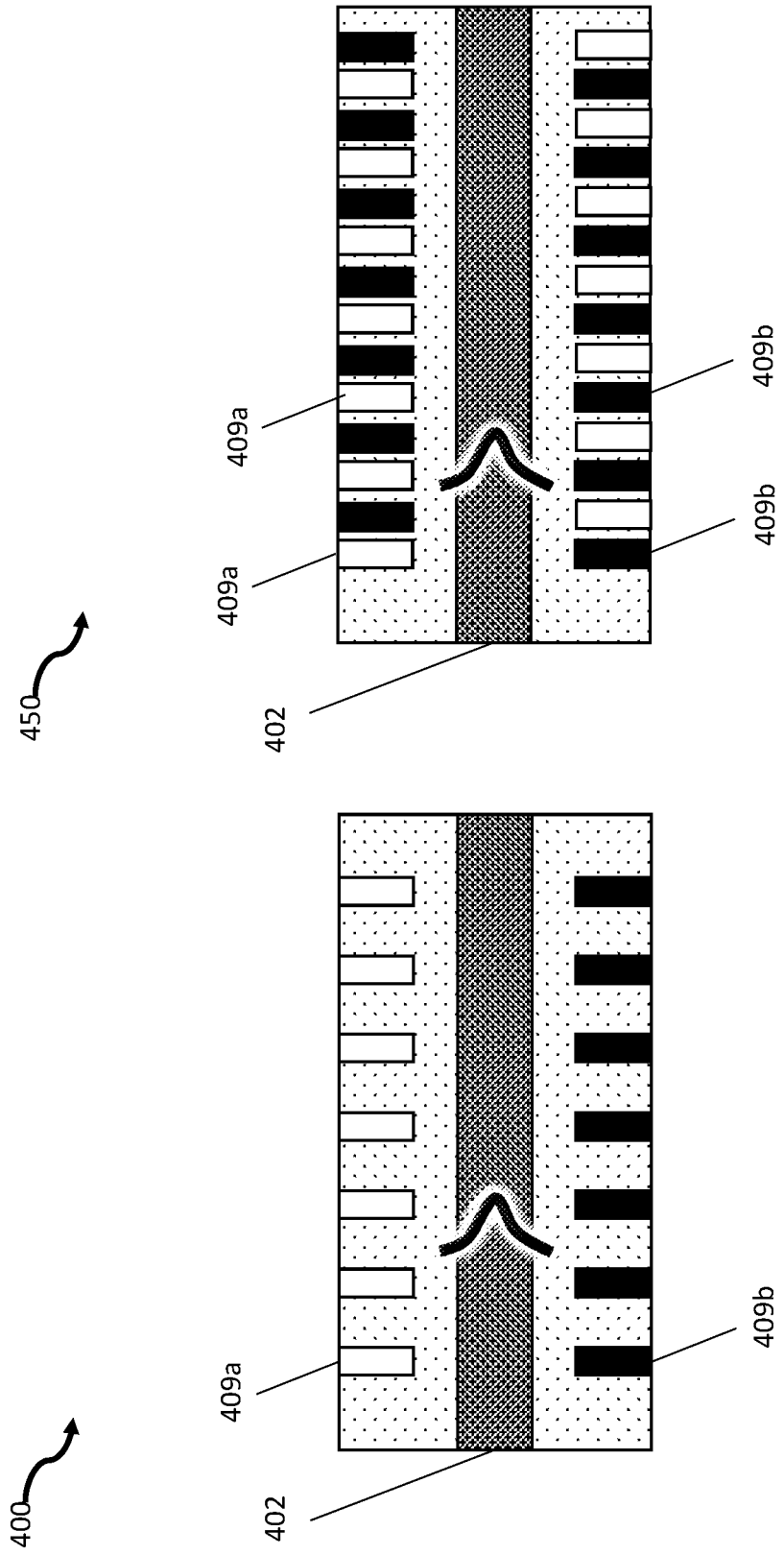
FIG. 4 shows a cross-sectional top-down views of two devices according to some embodiments of the present invention.

FIG. 4 depicts two embodiments of the present invention shown in top-down views 400 and 450 in the region where non-linear interaction is optimized. In these embodiments, periodic electrodes are used both to enhance the non-linearity and provide quasi-phase matching. The pitch of the periodic electrodes should obey the quasi-phase-matching and/or resonance conditions (in the case of resonators) at fundamental and converted frequencies, optimizing frequency conversion, as is known to those skilled in the art.

In the embodiment shown in view 400, two electrode groups are utilized. One group of electrodes 409a, shown in white, provides the anode, and other group, 409b, shown in black, provides the cathode. Groups are positioned in such way that one type of electrodes is to one side of the waveguide 402, e.g., above it as shown, and the other type, shown in black is on the opposite side (below it as shown).

In the embodiment shown in view 450, two electrode groups are also utilized, but in a different arrangement. A group of electrodes, 409a, provides the anode, and the other group, 409b, provides the cathode, but the two groups are positioned in an interdigitated periodic configuration. In the shown embodiment, the interdigitation is present on both sides (top and bottom) of waveguide 402, but in other cases, it may be on only one side. The pitch between electrodes of each group is again selected such that the frequency conversion is optimized.

Figure 5:
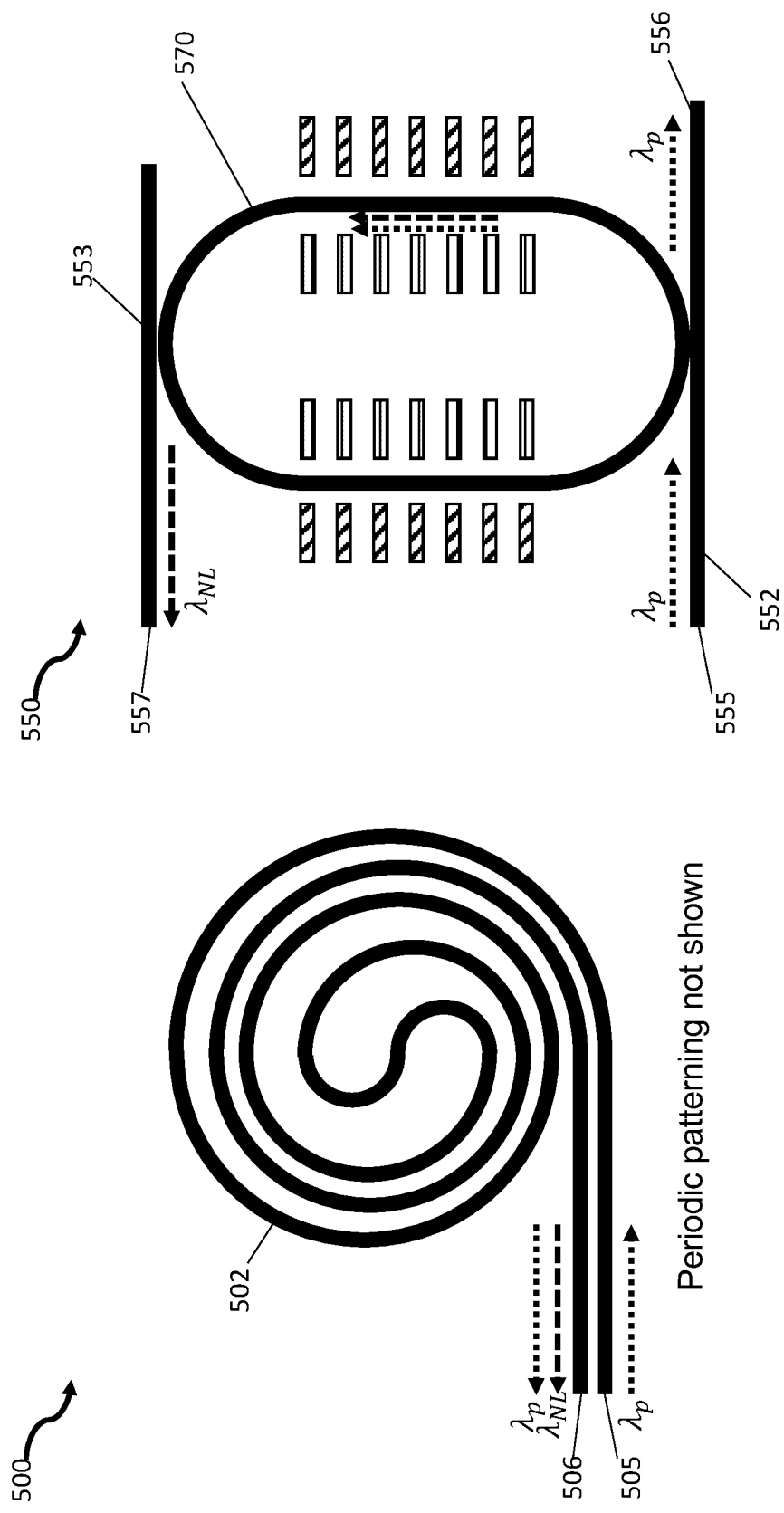
FIG. 5 shows a cross-sectional top-down views of two devices according to some embodiments of the present invention.

FIG. 5 depicts two embodiments of the present invention shown in top-down views 500 and 550, in the region where non-linear interaction is optimized. In these embodiments, the interaction length between the optical pump signal and the frequency converted signal is increased resulting in more efficient non-linear frequency generation as will be described below.

In the embodiment shown in view 500, the interaction length is increased by designing a longer waveguide structure 502, typically laid out in a spiral fashion. The waveguide structure, in the region(s) optimized for frequency conversion, can be implemented to make use of any of the electrode configurations shown in FIGS. 3 and 4. In some embodiments, waveguide crossings are to be avoided and a double spiral as sketched in view 500 is utilized. The optical pump signal ($\lambda_p$) enters the waveguide structure 502 at input port 505 and as it propagates along the waveguide structure 502, a frequency converted signal ($\lambda_{NL}$) is generated utilizing the non-linearity of the waveguide material, and propagating in the same direction as the pump signal. Both the pump signal and the frequency converted signal are present at the output 506, their precise power ratio defined by the efficiency of the non-linear process. In other embodiments (not shown) crossings can be used to increase density (total length vs total area) of the structure. In yet other embodiments, other geometries, most suitable for manufacturing, are designed.

In the embodiment shown in view 550, resonant structures such as e.g. ring resonators, racetrack resonators or similar, are used to increase the interaction between the pump and frequency converted signal using the effective cavity length of the resonator and/or power buildup inside the resonator. Various resonator configurations can be utilized such as e.g., an add-drop resonator 570 (as shown in view 550), an all-pass resonator (not shown), multiple coupling regions with a single ring (more than two), and/or multiple rings (with one or more coupling points) designs, with a goal of optimizing the performance in terms of conversion efficiency. The waveguide structure of resonator 570 in the regions optimized for frequency conversion, can be implemented to make use of any of the electrode configurations shown in FIGS. 3 and 4. The optical pump signal ($\lambda_p$) enters the waveguide structure 552 at input port 555 and as it propagates along the waveguide structure 552 is at least partly coupled to resonator 570. Precise coupling strength is an optimization parameter for the device efficiency with the non-coupled part leaving the structure at output 556. A frequency converted signal ($\lambda_{NL}$) is generated inside the resonator 570 utilizing the non-linearity and the power buildup inside the resonator and propagating in the same direction as the coupled optical pump. The frequency converted signal is efficiently coupled out to bus waveguide 553 and leaves the structure at output port 557. A portion of the pump signal can also be present at the output port 557, but output port 557 primarily serves as an output for the frequency converted signal and is optimized for that purpose. Similarly, output port 556 can also have part of the frequency converted signal, but output port 556 primarily serves as output for any residual non-converted pump signal and is optimized for that purpose. Optimization is commonly done by adjusting the wavelength sensitive coupling ratios of the resonator.

Either of the two periodic electrode pattern cases shown in FIG. 4 can be utilized to optimize the non-linear effects of the increased interaction length designs of FIG. 5, though only one is shown explicitly, in view 550. The arrows with short dashed lines show the directions of the optical pump ($\lambda_p$) (defined by direct emission laser integrated with non-linear element) and the arrows with long dashed lines show the directions of the frequency converted signal ($\lambda_{NL}$). In the case of a resonator approach, optimization of the coupling structure can facilitate higher efficiency, as is known to someone skilled in the art.

Figure 6:
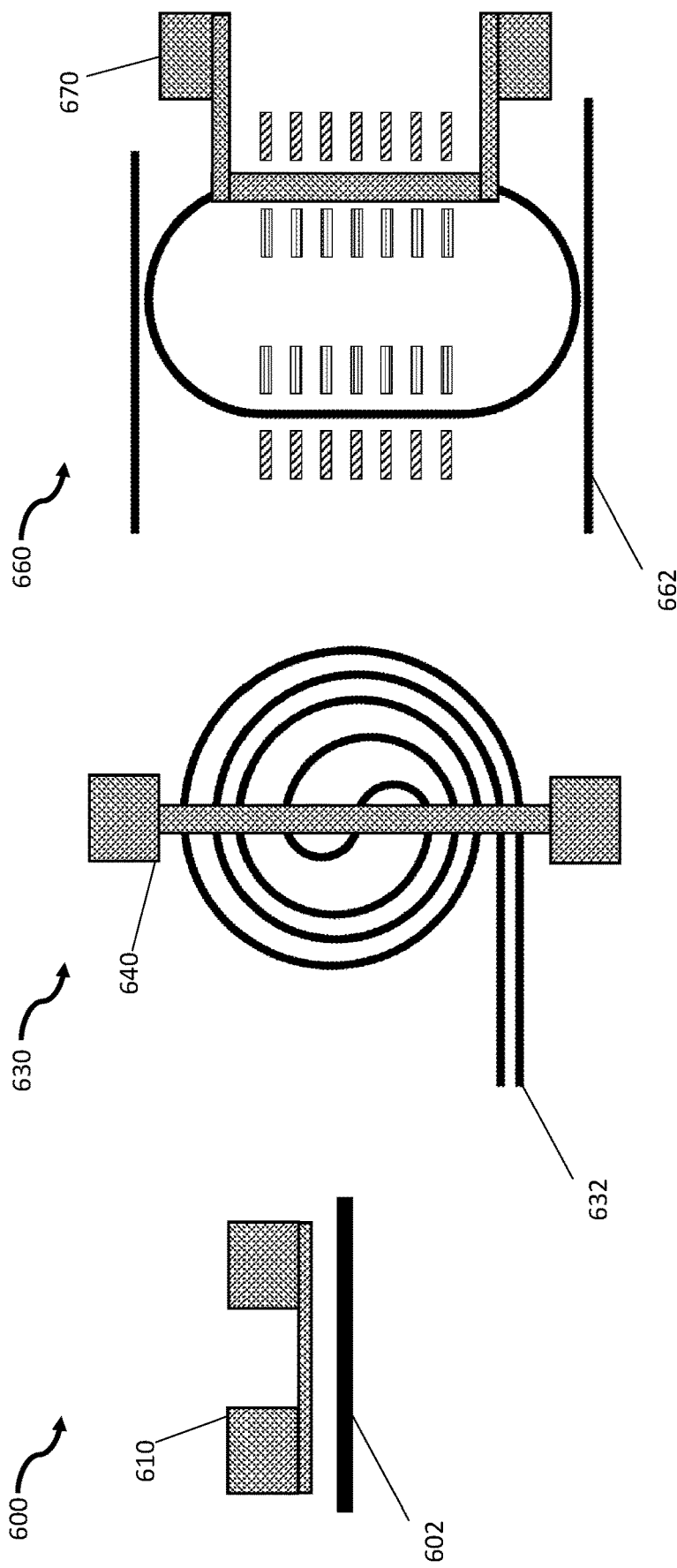
FIG. 6 shows a cross-sectional top-down views of three devices according to some embodiments of the present invention.

FIG. 6 depicts three embodiments of the present invention shown in top-down views 600, 630 and 660 in the region where non-linear interaction is optimized. In these embodiments, the non-linear effect in the passive waveguide is optimized using tuner elements resulting with more efficient non-linear frequency generation as phase matching condition is improved.

In view 600, a device with an optimized waveguide realized in layer 602 (as described with the help of e.g., FIG. 3 and layer 302) and at least one tuner element 610 is shown, with tuner element 610 enabling phase matching control.

Such a device can include additional electrodes (not shown) as described with the help of FIGS. 3-5.

In view 630, a device with a spiral like geometry (similar to that shown in view 500) with an optimized waveguide realized in layer 632 and at least one tuner element 640 is shown, with tuner element 640 enabling phase matching control. Such a device can include additional electrodes (not shown) as described with the help of FIGS. 3-5.

In view 660, a device with a resonant structure (similar to that shown in view 550) with an optimized waveguide realized in layer 662 and at least one tuner element 670 is shown, with tuner element 670 enabling phase matching control. Such a device can include additional electrodes (not shown) as described with the help of FIGS. 3-5.

In all cases, the tuner can be optimized in terms of layout, length and/or placement to provide better efficiency or other desired characteristics as is known in the art of designing photonic based tuners. In some embodiments, a thermal tuning effect is utilized.

Figure 7:
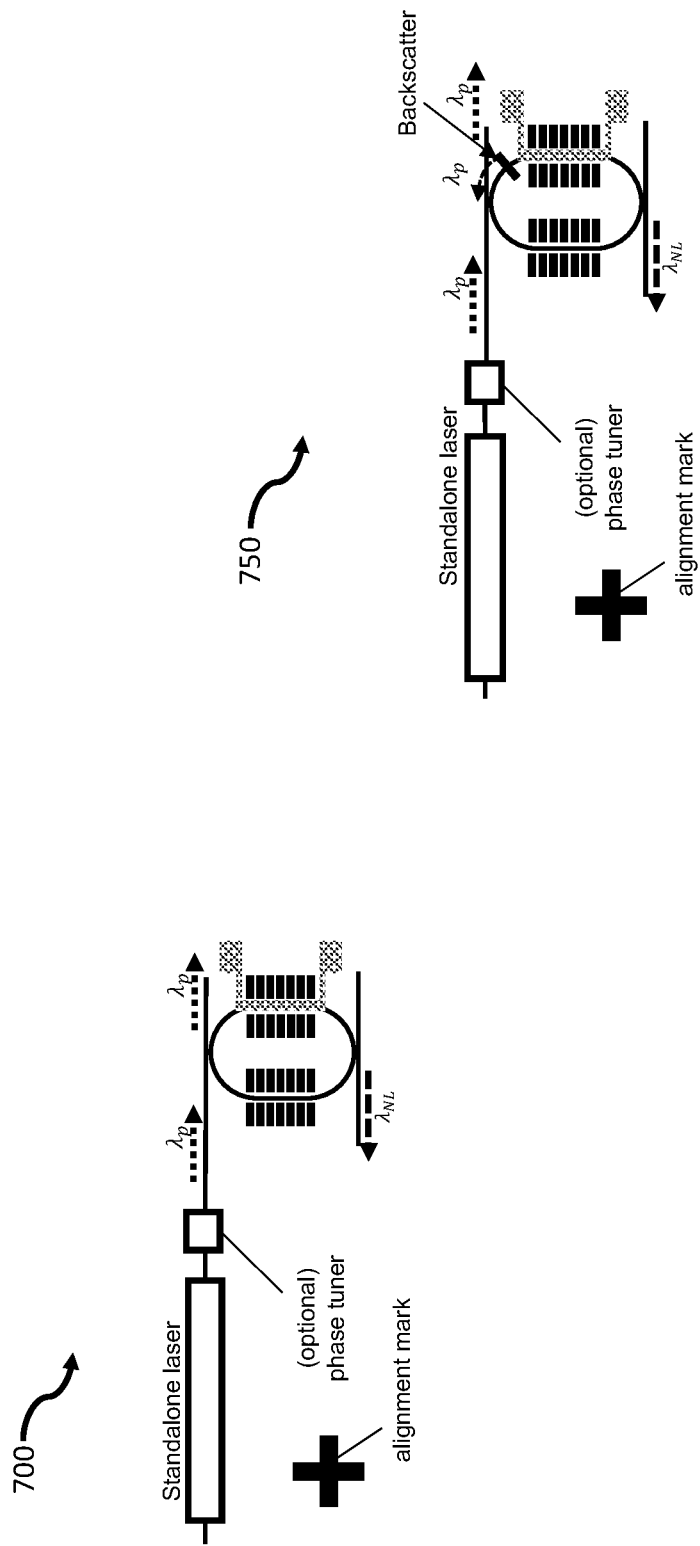
FIG. 7 illustrates photonic integrated circuit (PIC) based lasers according to two embodiments of the present invention.

Views 700 and 750 in FIG. 7 depict two embodiments of a photonic integrated circuit (PIC) based laser utilizing the present invention. In both embodiments, a standalone laser is coupled to a resonator-based non-linear element. A definition of a standalone laser is a laser that would lase without any additional elements, meaning it comprises a gain element or elements and mirrors that form a laser cavity, where said mirrors, in some embodiments, can also serve to select a single longitudinal mode to make a single-frequency laser. In other embodiments, gratings are formed in the gain element(s) to realize a single-frequency (DFB) laser. In yet other embodiments, said mirrors are tunable, making a widely-tunable laser.

View 700 shows an embodiment utilizing a standalone laser that is coupled to a non-linear resonator structure to provide for non-linear frequency conversion. In the critically coupled case, there is no power outputted to the right of the resonator in the orientation shown in the figure, but in most cases some small fraction of the power incident to the resonator is transmitted to the right, as the extinction ratio is not infinite. The signal coupled to the resonator is frequency converted and coupled out at the second coupling port of the resonator (outputted to the lower right as shown). Similar functionality can be provided with just one coupling port to the resonator (not shown) or with three or more coupling points to the resonator (not shown). A phase tuner is an optional element that can be included to facilitate higher performance of the PIC.

In view 750, the overall arrangement is similar to that in view 700, but in this case there is backscatter of the pump wavelength from the resonator due either to intentional defects or to general fabrication imperfections, in either case resulting in injection locking the laser to the resonator. Such injection locking has been shown to improve the linewidth of the laser provided that the resonator quality factor is sufficiently high. Several orders of magnitude or even larger linewidth improvements have been demonstrated with high-Q resonators supported by modern semiconductor processing. General operation is similar to device shown in view 700, with device shown in view 750 generally having lower linewidth. A phase tuner is an optional element that can be included to facilitate higher performance of the PIC.

Figure 8:
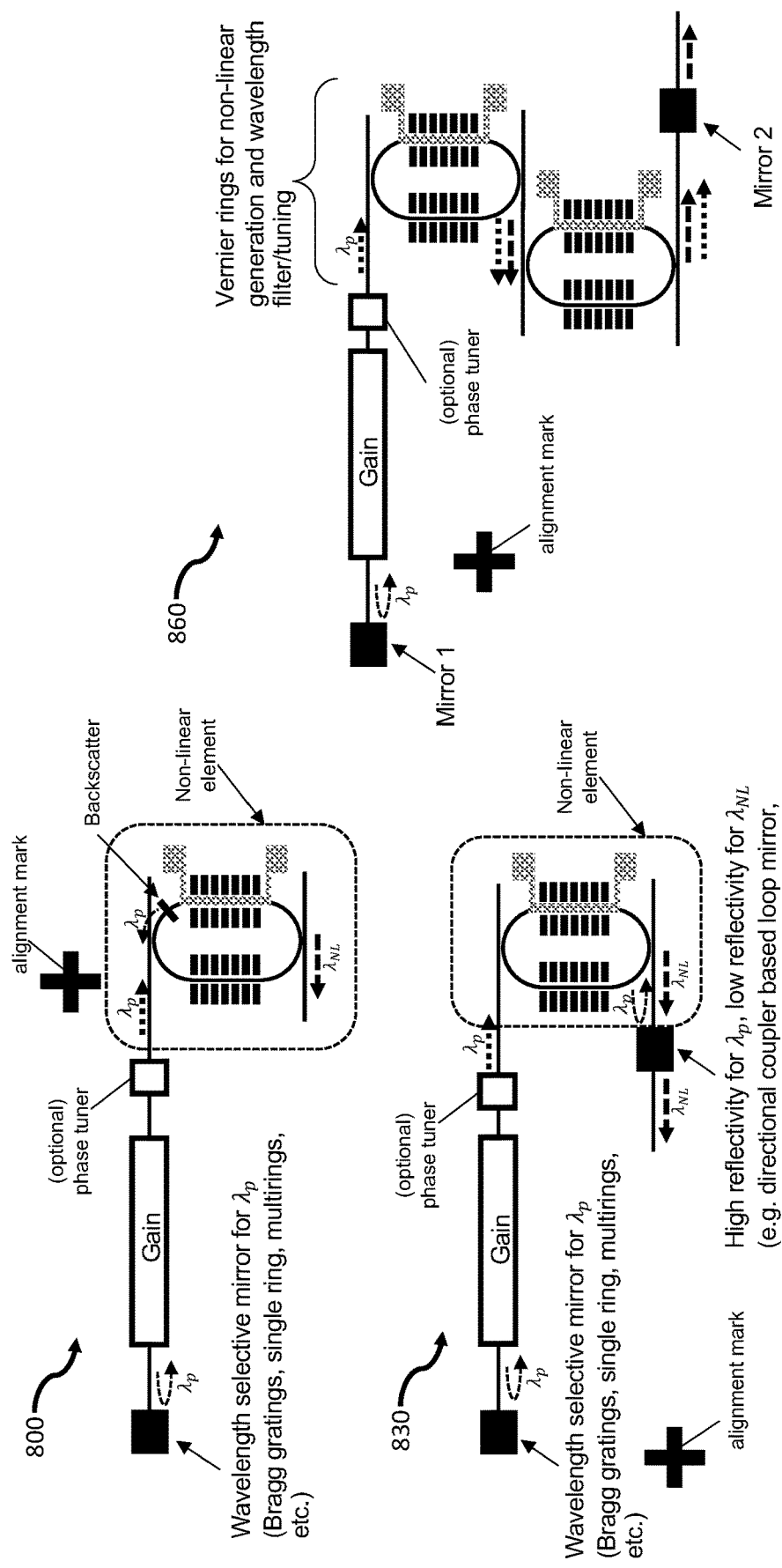
FIG. 8 illustrates photonic integrated circuit (PIC) based lasers according to three other embodiments of the present invention.

Views 800, 830 and 860 in FIG. 8 depict three embodiments of a photonic integrated circuit (PIC) based laser utilizing the present invention. In all these embodiments, the non-linear element is a part of the laser cavity, in contrast to the embodiments shown in FIG. 7. A phase tuner, in all embodiments, is an optional element that can facilitate higher performance of the PIC.

In view 800, the non-linear resonator is utilized as one of the mirrors due to the intentional defects in the resonator or general fabrication imperfection resulting in back reflection to the gain element. The second mirror, required to complete the cavity, can be realized in multiple ways including gratings, loop-mirrors, ring resonators and/or various combinations of thereof.

In view 830, two separate mirrors are used to form the cavity together with gain. Both mirrors can be designed to provide optimal response, e.g., high reflectivity for the optical pump ($\lambda_p$) and lower reflectivity for the frequency converted signal ($\lambda_{NL}$). In this way, the laser threshold can be optimized at the same time as the extraction efficiency of the frequency converted signal. The non-linear element is inserted between the two mirrors to provide efficient frequency conversion. These mirrors can be tunable to provide for wavelength tuning of the PIC based laser.

In view 860, a similar arrangement to that in the device shown in view 830 is utilized, but multiple non-linear resonator elements are utilized to support broadband tuning and/or higher conversion efficiency.

It is to be understood that these illustrative embodiments teach just some examples of PIC based lasers utilizing the present invention, and many other similar arrangements can be envisioned. Furthermore, such PIC based lasers can be combined with multiple other components to provide additional functionality or better performance such as various filtering elements, amplifiers, monitor photodiodes, modulators and/or other photonic components.

Embodiments of the present invention offer many benefits. The integration platform enables scalable manufacturing of PICs made from multiple materials providing higher-performance and/or ability to operate in wavelengths that are challenging for native direct emission lasers by using non-linearity for frequency conversion. Furthermore, the platform is capable of handling high optical power compared to typical Si waveguide-based or InP waveguide-based PICs.

Previous approaches have generally used taper structures in order to transfer an optical mode from an III/V semiconductor active device (101) to a passive device (102), where a width of compound semiconductor region is adiabatically tapered down to sub-micron size. However, a required width of the taper tip decreases rapidly to tens of nanometer sizes as the difference in refractive indices increases. The present invention deploys a butt coupling scheme to eliminate the need of a very small taper size in the compound semiconductor waveguide (101 in FIG. 1), which eases fabrication of such structures.

Other approaches have relied on die attachment of pre-fabricated optical active devices to passive waveguides. This requires very stringent alignment accuracy, which is typically beyond what a typical die-bonder can provide. This aspect limits the throughput of this process as well as the performance of optical coupling.

This present invention utilizes a process flow consisting typically of wafer-bonding of a blanket piece of compound semiconductor material on a carrier wafer with dielectric waveguides (as is described with the help of FIG. 1) and subsequent semiconductor fabrication processes as is known in the art. It enables an accurate definition of optical alignment between active and passive waveguides via typically photo lithography step, removing the need for precise physical alignment. Said photo lithography-based alignment allows for scalable manufacturing using wafer scale techniques.

Efficient optical transfer between dissimilar materials is facilitated by using a butt-coupling approach in combination with a mode-converter (the intermediate waveguide) that removes the need for narrow taper tips that are challenging to resolve and fabricate with current state-of-the-art tools.

It is to be understood that optical coupling between modes in active and passive layers is reciprocal, so that, taking FIG. 1 as exemplary, the structure can be configured to facilitate light transmission from region 101 to region 102, but also to facilitate transmission in the reverse direction, from region 102 to region 101. In is to be understood that multiple such transitions with no limitation in their number or orientation can be realized on a suitably configured PIC.

In some embodiments the active device can utilize the substrate for more efficient thermal sinking, due to direct contact to the substrate with no dielectric in-between.

In some embodiments, the active device creates a hybrid waveguide structure with dielectric layers which can be used, for example, to create a wavelength selective component formed inside the laser cavity for e.g. distributed feedback (DFB) lasers or similar components.

Embodiments of the optical devices described herein may be incorporated into various other devices and systems including, but not limited to, various computing and/or consumer electronic devices/appliances, communication systems, sensors and sensing systems.

It is to be understood that the disclosure teaches just few examples of the illustrative embodiment and that many variations of the invention can easily be devised by those skilled in the art after reading this disclosure and that the scope of the present invention is to be determined by the following claims.

The invention claimed is:

1. A device comprising:
first, second and third elements fabricated on a common substrate;
wherein the first element comprises an active waveguide structure supporting a first optical mode, the second element comprises a passive waveguide structure supporting a second optical mode, and the third element, at least partly butt-coupled to the first element, comprises an intermediate waveguide structure supporting intermediate optical modes;
wherein at least part of the second element is non-linear, supporting frequency conversion;
wherein a tapered waveguide structure in at least one of the second and third elements facilitates efficient adiabatic transformation between the second optical mode and one of the intermediate optical modes
wherein no adiabatic transformation occurs between any of the intermediate optical modes and the first optical mode; and
wherein mutual alignments of the first, second and third elements are defined using lithographic alignment marks that facilitate precise alignment between layers formed during processing steps of fabricating the first, second and third elements.

2. The device of claim 1,
wherein the third element directly overlies a planarized top surface realized by planarization prior to third element deposition.

3. The device of claim 1,
wherein the interface between first and third elements is angled at an angle optimized to minimize reflections.

4. The device of claim 1,
wherein the non-linear part of the second element has waveguide dimensions optimized for maximizing the frequency conversion.

5. The device of claim 1,
wherein the non-linear part of the second element comprises at least two electrodes configured to maximize the frequency conversion caused by an electric field applied by the two electrodes.

6. The device of claim 5,
wherein the electrodes are laterally offset from a core of a passive waveguide in the passive waveguide structure in a plane parallel to a bottom surface of the common substrate.

7. The device of claim 5,
wherein the electrodes are vertically offset from a core of a passive waveguide in the passive waveguide structure in a plane perpendicular to a bottom surface of the common substrate.

8. The device of claim 7,
wherein at least one of the electrodes utilizes substrate conductivity to optimize the electric field distribution.

9. The device of claim 5,
wherein the non-linear part of the second element comprises at least two groups of electrodes, electrodes within each group separated by a pitch selected to optimize the frequency conversion.

10. The device of claim 9,
wherein at least one group of the groups of electrodes is interdigitated with another group of the groups of electrodes.

11. The device of claim 1,
where the non-linear part of the second element comprises a resonant structure configured to enhance the frequency conversion.

12. The device of claim 11,
where the resonant structure in the second element comprises at least two electrodes.

13. The device of claim 1,
where the non-linear part of the second element comprises a spiral-based delay structure configured to enhance the frequency conversion.

14. The device of claim 13,
where the spiral-based delay structure in the second element comprises at least two electrodes.

15. The device of claim 1,
wherein the non-linear part of the second element comprises at least one tuner element configured to adjust phase matching and enhance the frequency conversion.

16. The device of claim 11,
wherein the resonant structure in the non-linear part of the second element comprises at least one tuner element.

17. The device of claim 13,
wherein the spiral-based delay structure in the non-linear part of the second element comprises a tuner element.

18. The device of claim 1,
wherein the first element comprises a GaAs laser;
wherein the second element comprises a SiN waveguide structure;
wherein the third element comprises a material with refractive index lower than SiN and providing efficient optical coupling between the first element and the second element; and
wherein at least part of an output from the GaAs laser is frequency doubled at the second element.

19. The device of claim 18, where the non-linear structure of the second element comprises a resonant structure configured to enhance the frequency doubling.

20. The device of claim 1:

wherein the first element comprises an InP laser;

wherein the second element comprises a SiN waveguide structure;

wherein the third element comprises a material with refractive index lower than SiN and providing efficient optical coupling between first and third element; and wherein at least part of an output from the InP laser is frequency doubled at the second element.

* * * * *